United States Patent [19]
O'Brien, Jr.

[11] Patent Number: 4,802,124
[45] Date of Patent: Jan. 31, 1989

[54] NON-VOLATILE SHADOW STORAGE CELL WITH REDUCED TUNNEL DEVICE COUNT FOR IMPROVED RELIABILITY

[75] Inventor: George D. O'Brien, Jr., Scottsdale, Ariz.

[73] Assignee: SGS-Thomson Microelectronics, Inc., Carrollton, Tex.

[21] Appl. No.: 81,032

[22] Filed: Aug. 3, 1987

[51] Int. Cl.$^4$ .............................................. G11C 11/34
[52] U.S. Cl. .................................. 365/185; 365/203; 365/189
[58] Field of Search ............... 365/189, 182, 185, 203, 365/154, 228

[56] References Cited

U.S. PATENT DOCUMENTS

| | | | |
|---|---|---|---|
| 4,510,584 | 4/1985 | Dias et al. | 365/203 |
| 4,545,035 | 10/1985 | Guterman et al. | 365/185 |
| 4,651,303 | 3/1987 | Dias et al. | 365/185 |

Primary Examiner—Joseph A. Popek
Attorney, Agent, or Firm—M. David Shapiro

[57] ABSTRACT

A non-volatile storage cell utilizing a single isolation device, preferably of the Fowler-Nordheim tunneling type for each non-volatile cell module and wherein an improved level shifting input/output circuit is incorporated into each such cell.

4 Claims, 8 Drawing Sheets

NON-VOLATILE SHADOW STORAGE CELL WITH REDUCED TUNNEL DEVICE COUNT FOR IMPROVED RELIABILITY

FIELD OF THE INVENTION

The invention relates to a non-volatile CMOS or NMOS shadow storage cell in which the number of isolation tunnel devices and the associated required silicone area is reduced by fifty percent and wherein improved level shifter(s) may be utilized in the input-/output portion of the circuit.

BACKGROUND OF THE INVENTION

Non-volatile memory cells are commonly used to store data derived from an associated volatile memory cell so that the data is not lost during a power-off period. These non-volatile cells are commonly referred to as "shadow" cells. The connections between the non-volatile cell and the volatile cell are usually bi-directional; they function as inputs during a non-volatile store operation and as outputs during a recall of the data to the volatile cell from the non-volatile cell. A source of relatively high voltage, on the order of from 10 to 20 volts, induces tunneling in one of a pair of Fowler-Nordheim (FN) isolation elements in the non-volatile cell during store operations. The FN element has a very high impendance when not in a tunneling state so that the stored charge is isolated from the rest of the circuit during power-off.

U.S. Pat. No. 4,510,584 issued to Leuschner, Guterman, Proebsting and Dias for a non-volatile memory cell is illustrated in the prior art schematic diagram of FIG. 1. Two Fowler-Nordheim (FN) tunneling elements 20, 22 are employed to store and isolate a charge on the gate of $Q_{24}$. Capacitor $C_{26}$ completes the isolation circuit. $C_{26}$ may be a FET type device. FN devices, 20, 22 may be implemented as two conducting layers separated by a thin (100 Angstrom) dielectric layer, such as $SiO_2$. Due to the bending of the conduction bands in the conductor layers, it is possible for electrons to tunnel through the dielectric layer with increasing probability as the electric field across the dielectric layer increases. The equation for this behavior is:

$$J = a * E^2 * e^{(-b/E)}$$

where:
 J = current density ($A/cm^2$)
 E = electric field strength (V/cm)
 a,b = constants
 e = 2.718 . . .

For the purpose of explanation of the circuits to be described, infra, the FN element may be considered as a bidirectional voltage triggered switch, similar to a pair of Zener diodes connected back to back. If the absolute potential across the FN element is less than the Fowler-Nordheim voltage the element is non-conducting and if the potential exceeds the Fowler-Nordheim voltage, then the element conducts with a very low impedance.

The advantage of the cell of FIG. 1 lies in the fact that it may be easily connected to a volatile storage element (not shown) via nodes D, $\overline{D}$ and that such connection does not interfere with normal operation of the volatile element. Thus, it is possible and practical to achieve both high speed operation and non-volatility. Recall of the non-volatile data occurs via node 21 which is usually connected to the volatile shadow memory cell which provided the D and $\overline{D}$ inputs. With single controlling transistor $Q_{24}$ and floating node 32 it is necessary to provide a minimum voltage difference between the two complementary data states of at least two to three volts because sensing transistor $Q_{24}$ must be turned on strongly enough in one data state to overcome the volatile element should it be in the opposite state. The voltage difference between the two complementary data states of the non-volatile element is directly related to the amount of charge passed through FN tunneling elements 20, 22.

The reliability of tunneling elements 20, 22, is, in turn, directly related to the oxide charge transfer and it is desirable to minimize the tunneling charge transfer to achieve maximum reliability. In addition, reliability is significantly dependent upon the oxide electric field-/current density and therefore, another objective is to minimize oxide current density.

These requirements are believed to have led to the circuit of FIG. 2 which has been marketed as a portion of Mostek Part No. MK 4701 where it is used as a reference cell. It may be observed, by comparing FIGS. 1 and 2, that the cell of FIG. 1 appears, in large part, in two places in FIG. 2. (Identical reference numerals are used in each half-module of FIG. 2 and the A and B suffices indicate a part which is used in both modules.) They are connected in complementary fashion to the volatile storage element (again, not shown) via nodes D and $\overline{D}$, as before. The important difference is that in the circuit of FIG. 2, nodes D and $\overline{D}$ serve both as input and output nodes. Because of the complementary nature of the circuit of FIG. 2, and the symmetry of the storage cell, it is not necessary to achieve a large voltage difference in the two data states stored simultaneously on nodes 32A and 32B, as it was in the circuit of FIG. 1. Thus it is possible to reduce tunneling current requirements and to enhance the reliability of FN tunneling elements 20A, 22A, 20B and 22B.

However, the prior art circuits of FIGS. 1 and 2 employ two tunnel devices per cell (in the case of FIG. 1) and four tunnel devices per cell (in the case of FIG. 2). Since the yield and reliability of such cells are a strong function of the number of tunneling devices used in each such cell, it would be advantageous to reduce the number of tunnel devices per cell.

In the circuits of FIGS. 1 and 2, FN devices 20, 22 always form a series path between the high voltage source and ground. This means that the high voltage must be chosen so that it never exceeds twice the Fowler-Nordheim voltage of the tunneling elements since, under that condition, both devices would conduct and a large current would flow from the high voltage node to the ground node. Such a large current would impact the reliability of the FN devices severely. It is clear that if either FN device of the pair were to fail, the circuit would disfunction.

In the circuits of the prior art, current always flows through a given FN device in the same direction. This is known to give rise to a phenomenon, well known in the art, as Fowler-Nordheim voltage "walkout," which has been shown to be a precursor to device breakdown and failure of the thin tunneling medium.

SUMMARY OF THE INVENTION

The invention according to the description herein utilizes half as many tunneling devices as the respectively equivalent cells described in the prior art, above. This is accomplished by means of an improved circuit which requires the use of half as many tunneling devices wherein a single tunneling device accomplishes the functions of two such devices in the prior art circuits. Moreover, the tunneling devices which are used conduct, alternately, in a bi-directional manner so that the F-N "walkout" problem is significantly diminished. This reduction, in turn, offers the dual advantages of higher yield and high reliability in the product of the invention.

The invention, according to the description herein, may also utilize an improved level shifting circuit. The improved circuit may be implemented in either P-well CMOS or N-well CMOS; in either case the advantages over the prior art are recognized.

It is therefore, an object of the invention to improve the reliability and useful life of a non-volatile shadow memory cell by reducing the number of tunneling devices per non-volatile memory cell by a factor of two.

It is another object of the invention to utilize the tunneling devices of the invention in a bi-directional mode, thus reducing F-N "walkout" problems.

It is still another object of the invention to provide an improved static level shifting circuit for a non-volatile shadow memory cell wherein capacitive boosting of transistor gates is not necessary.

It is yet another object of the invention to provide an improved level shifting circuit for a non-volatile shadow memory cell which allows the high voltage source to replace any long term lost charge.

It is a further object of the invention to provide an improved level shifting circuit for a non-volatile memory cell which provides for smaller devices, thus requiring less silicon area in the cell.

These and other advantages will be better understood upon review of the Detailed Description of the Invention taken together with the drawings, in which:

FIG. 1 is a representative schematic diagram of the prior art invention described in U.S. Pat. No. 4,510,584;

Figure 1:
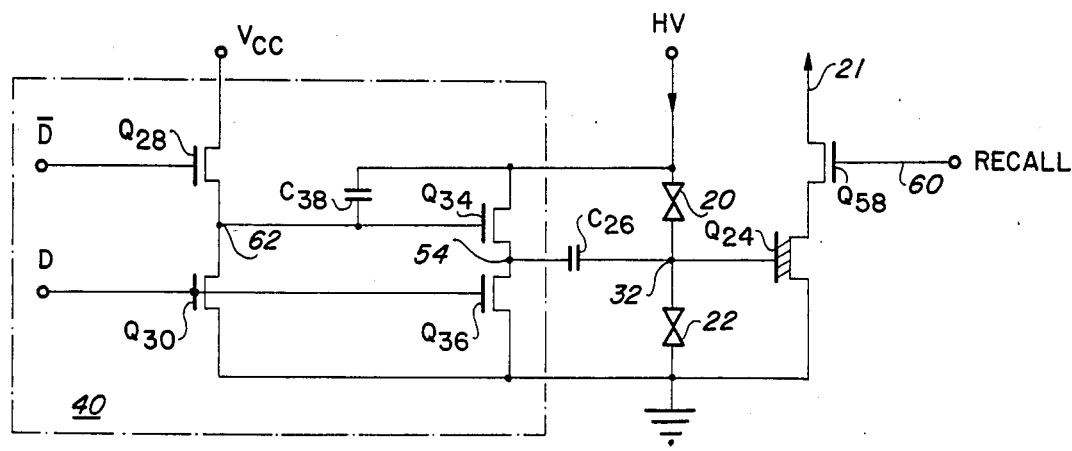

DETAILED DESCRIPTION OF THE PREFERRED EMBODIMENT OF THE INVENTION (It should be noted that wherever in this specification like reference numerals are used they refer to like features of the invention. Wherever an alphabetic suffix is appended to a reference numeral, it indicates that the so-referenced feature is being used to perform the same function as the non-suffixed feature. Whenever two different alphabetic suffixes are used on two identical reference numerals, it is an indication that the two referenced features are being used to perform an identical function in the two places where the feature is shown.)

Figure 3:
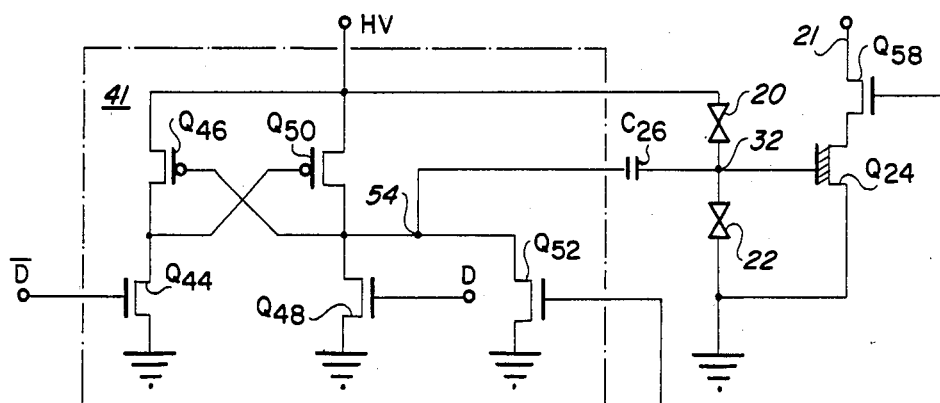
FIG. 3 is a schematic diagram of the circuit of the prior art invention of FIG. 1 incorporating an improved level shifter circuit, 41.

The circuit of FIG. 3 illustrates the substitution of an improved level shifting circuit 41 for circuit 40 of FIG. 1.

Circuit 41 is a level shifter including FET $Q_{44}$ with its gate connected to input terminal $\overline{D}$. The sink electrode of $Q_{44}$ is connected to ground. The drain electrode of $Q_{44}$ is connected to the sink electrode of P-channel FET $Q_{46}$ and to the gate electrode of P-channel FET $Q_{50}$. The drain electrode of $Q_{46}$ and the drain electrode of $Q_{50}$ are connected to HV, the high voltage source. The gate of $Q_{46}$ is connected to the drain electrode of FET $Q_{48}$, the drain electrode of $Q_{52}$ and to the sink electrode of P-channel FET $Q_{50}$ (the common connection is node 54). Node 54 is connected to the left side of $C_{26}$. The gate of $Q_{48}$ is connected to input terminal D. The sink electrode of $Q_{48}$ is connected to ground. The gate electrode of $Q_{52}$ is connected to RECALL terminal 60. The sink electrode of $Q_{52}$ is connected to ground.

Transistors $Q_{46}$ and $Q_{50}$ comprises a latching circuit with feedback provided from the sink of each to the gate of the other.

Note that the two FN tunneling devices 20, 22, through which charge and discharge current flows to and from node 32, remain in this version of the improved circuit. Node 32 is, of course, connected to the floating gate of controlling transistor $Q_{42}$.

Circuit 41 acts to switch the programming voltage, HV, as needed within the non-volatile storage cell of the improved circuit shown in FIG. 3. If the state of the volatile storage element (connected to D and $\overline{D}$, but not shown) is such that terminal D is at a high level and terminal $\overline{D}$ is at a low level, then node 54 is held low by N-channel FET $Q_{48}$. P-channel FET $Q_{46}$ (with a low level on its gate) then connects the gate of FET $Q_{50}$ to HV and $Q_{50}$ is turned off. Since the coupling capacitor $C_{26}$ is relatively large compared to the capacitance of node 32, node 32 closely follows the voltage changes at node 54 until one of the FN devices 20, 22 begins to conduct. When the potential across FN 20 reaches the Fowler-Nordheim voltage, electrons tunnel from node 32 to HV, resulting in a net positive charge accumulation across capacitor $C_{26}$.

During RECALL, node 54 is grounded through $Q_{52}$ and, since node 32 terminal of capacitor $C_{26}$ is positively charged, FET $Q_{24}$ is in a conducting, turned on, state.

Conversely, when the D and $\overline{D}$ terminals are at low and high levels, respectively, node 54 is pulled up to the high voltage potential of HV via P-channel FET $Q_{50}$ which has its gate held to a low voltage level by FET $Q_{44}$. Again, node 32 closely follows node 54 and a sufficiently large voltage appears across FN 22 so that electrons tunnel from ground to node 32, effectively clamping node 32 to the FN voltage while capacitor $C_{26}$ terminal at node 54 continues to rise. This results in a net negative charge accumulation at node 32 which causes FET $Q_{24}$ to be placed in a non-conducting, or turned off, state. Thus, controlling transistor $Q_{24}$ has two states; conducting (net positive charge at node 32) and non-conducting (net negative charge at node 32).

The data stored in the cell of FIG. 3 is sensed via node 21. Node 21 may be connected to the same volatile storage element which provides the signals at input terminals D and $\overline{D}$. Sensing of the non-volatile data is initiated by applying a high level to the gate of FET $Q_{58}$ via RECALL terminal 60. Current flows to the ground node if transistor $Q_{24}$ is conducting and no current flows if $Q_{24}$ is not conducting. Thus, the circuit effects non-volatile memory storage in the same way as in the prior art circuit of FIG. 1.

The advantages offered by the application of a level shifting technique, as exemplified by FIG. 3, are manyfold; the circuit operation is fully static, i.e.; the gate of transistor $Q_{50}$ is not capacitively boosted, but, rather, the circuit is d.c. coupled. In the prior art according to the circuit of FIG. 1, the subthreshold leakage of transistors $Q_{28}$ and $Q_{30}$ and the junction leakage of node 62 is of concern as node 62 is expected to rise with the high voltage node HV over a long period of time. Furthermore, capacitor $C_{38}$ of FIG. 1 is made to be a relatively large device in order to achieve effective coupling of the high voltage to the gate of transistor $Q_{34}$.

Level shifting circuit 41 overcomes both of these drawbacks. It allows the high voltage node HV to replace any charge lost from node 54 via leakage and the silicon area required for the four devices of FIG. 3 is smaller since there is no equivalent to coupling capacitor $C_{38}$.

Transistor $Q_{52}$ is an optional device which may be required for correct sensing of the non-volatile data during recall of the data by the volatile storage element. Floating gate node 32 is only defined as a voltage differential across coupling capacitor $C_{26}$ caused by the FN induced charge stored in $C_{26}$. In order for the gate of transistor $Q_{24}$ to be defined, the other side of coupling capacitor $C_{26}$, node 54, must first be defined. If the application of the non-volatile storage requires that the non-volatile gate be recalled into the volatile storage element at the initial application of power to the cell, it is necessary to define the voltage at node 54 via transistor $Q_{52}$ as D, $\overline{D}$ and node HV will initially be low at power-up. This condition would otherwise leave node 54 at an undefined level.

Figure 2:
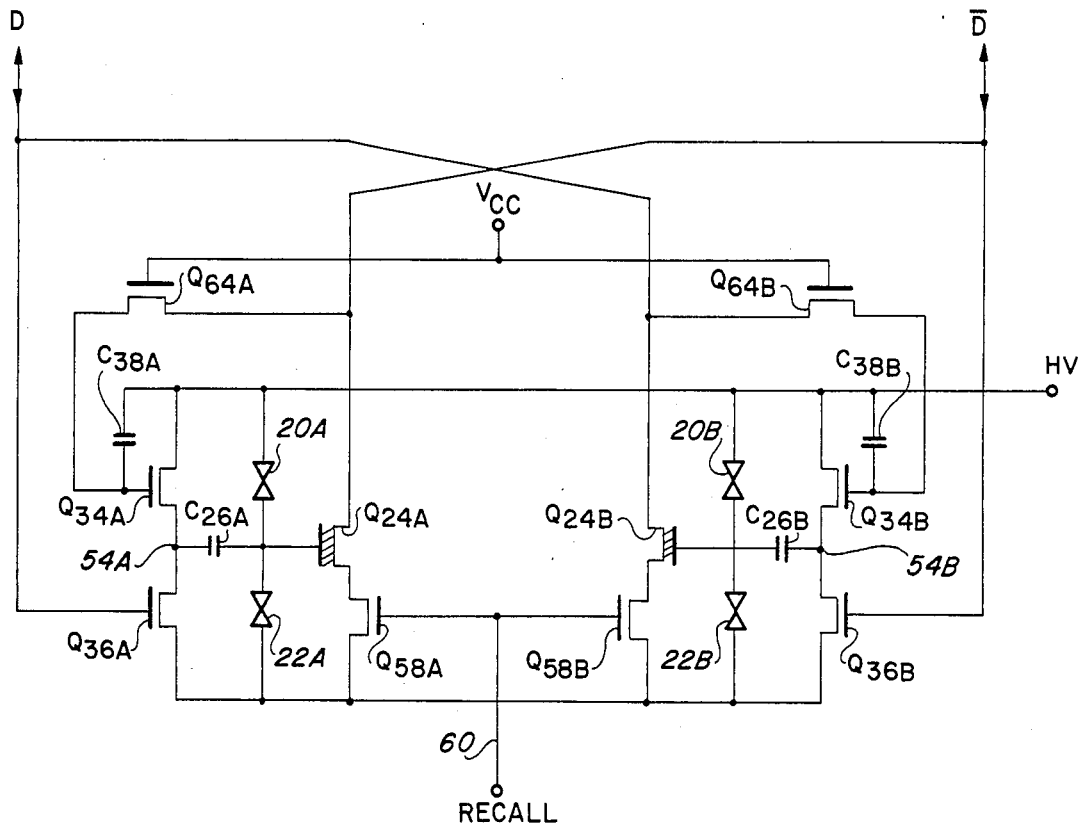
FIG. 2 is a prior art schematic diagram of a portion of Mostek Part No. MK 4701.
Figure 4:
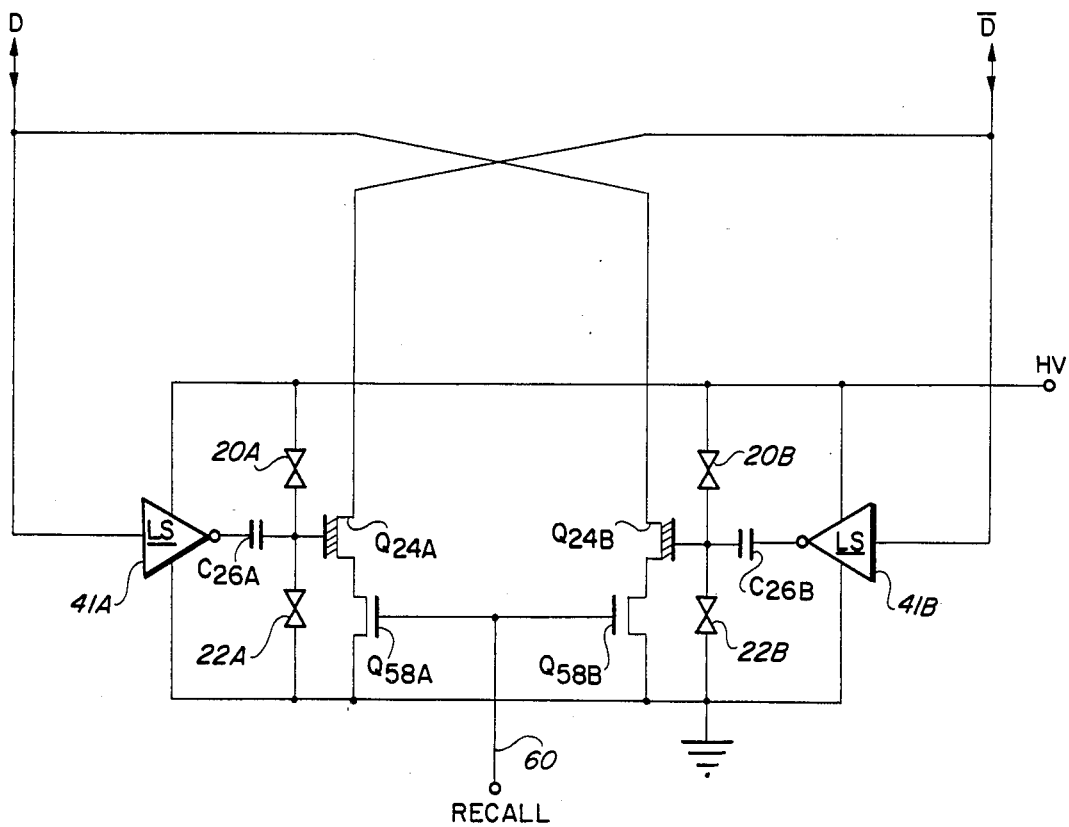
FIG. 4 is a schematic diagram of the circuit of FIG. 2 with the level shifting mechanisms indicated generically as LS, 41A, and 41B, in block diagram form.

FIG. 4 illustrates the principle described above, for FIG. 3, as it is applied to the prior art differential circuit of FIG. 2. In the circuit of FIG. 4, the advantages of the level shifting technique are multiplied because it is only necessary to use the four devices comprising the level shifter once, even though there are two sets of tunneling elements, 20A and 20B, 22A and 22B. Furthermore, four elements, transistors 64A and 64B and capacitors $C_{38A}$ and $C_{38B}$ are eliminated since they are no longer necessary.

Figure 5:
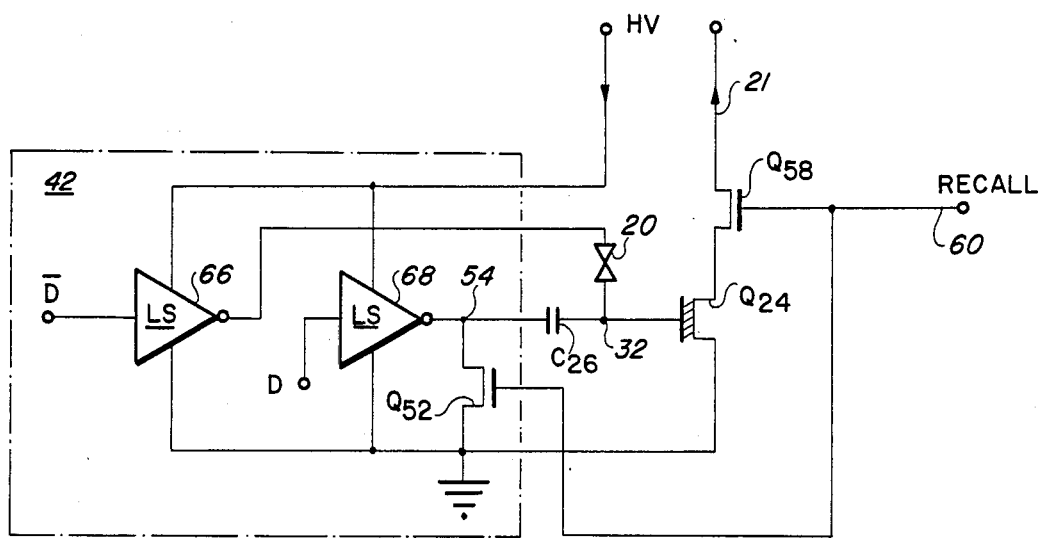
FIG. 5 is a schematic diagram of an implementation of the invention in N-well CMOS technology as applied to a single ended cell, as in the prior art circuit of FIG. 1, wherein the level shifting circuit is shown in block diagram form in conjunction with a single FN tunneling device.

FIG. 5 depicts a schematic diagram of a still further improved embodiment of the invention as it would be applied to improve the circuit of FIG. 3. Level shifter 66 has been added to the original circuit of FIG. 3 and connected as shown with its input terminal connected to $\overline{D}$, its power supply terminal connected to HV and its output terminal connected to FN 20. This circuit further departs from that of FIGS. 1 and 3 in that FN 22 of those Figures has been deleted. The upper end of FN 20 is no longer connected directly to high voltage node HV, but, rather, is connected to the output of level shifter 66.

Figure 3A:
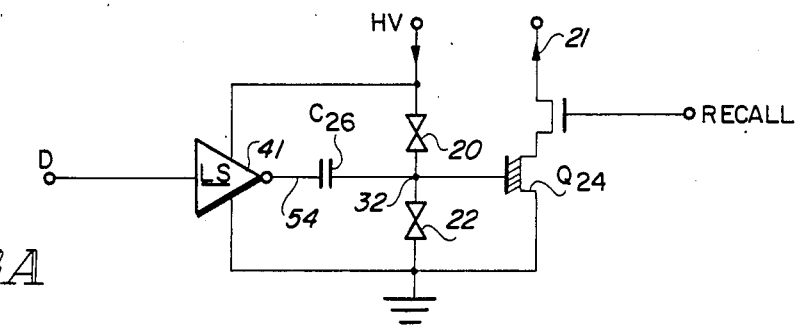
FIG. 3A is a schematic diagram of the circuit of FIG. 3 with level shifting mechanism 41 indicated generically as LS (Level Shifter) 41 in block diagram form.

The input terminal of a second level shifter 68 is connected to D, the output terminal is connected to node 54 and the power supply terminal is connected to HV. Level shifter 68 replaces level shifter 41 of FIGS. 3 and 3A to the extent that it is connected to the left end of capacitor $C_{26}$ at node 54.

To effect a net positive charge on node 32, D and D must be at high and low levels, respectively, as before. The high voltage HV appears at the output of level shifter 66 and electron tunneling occurs in $FN_{20}$ as before. To induce a net negative charge accumulation at node 32, the D and D inputs are set to the opposite states, as before. High voltage then appears at node 54 via level shifter 68, and node 32, being closely coupled to node 54, rises with the high voltage at nodes HV and 54. Level shifter 66 with a high level at its input holds the upper end of FN 20 at ground potential. Thus, the electrons enter node 32 via the same tunneling element 20 through which they were removed. Tunneling element 22 of FIG. 3 is no longer necessary and is deleted. Since charge and discharge of the floating gate device $Q_{24}$ is accomplished by drawing both charge and discharge current through FN 20 in *both* directions, the "walkout" effect in that device is significantly reduced.

Figure 6:
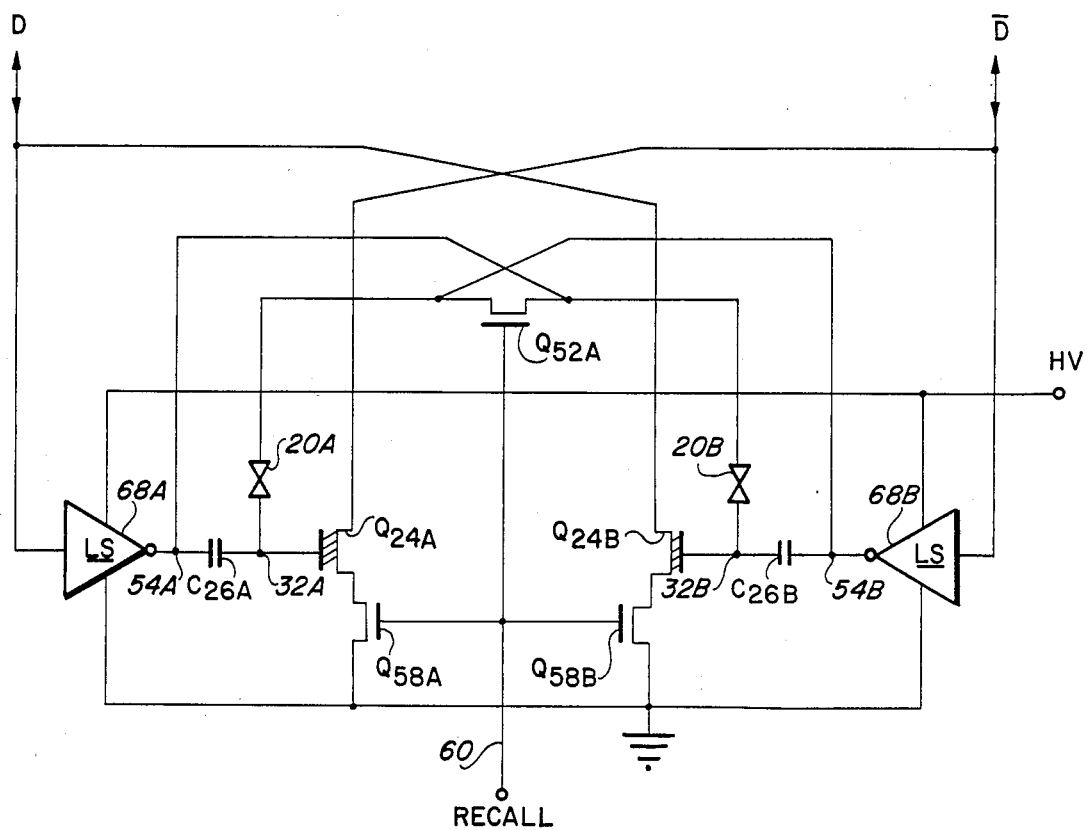
FIG. 6 is a schematic diagram of a differential cell implementation of the invention wherein a single FN tunneling device is employed in each side of the differential circuit and the level shifter is indicated generically in block diagram form.

FIG. 6 is a schematic diagram of an implementation of the embodiment of the invention of FIG. 5, as applied to the differential circuit of FIGS. 2 and 4. The device count is again reduced because of the dual functions of the level shifters. 68A and 68B, eliminating the need for the equivalent circuit of level shifter 66, and the elimination of half of the FN devices, 22A and 22B as shown in FIGS. 2 and 4.

Figure 7:
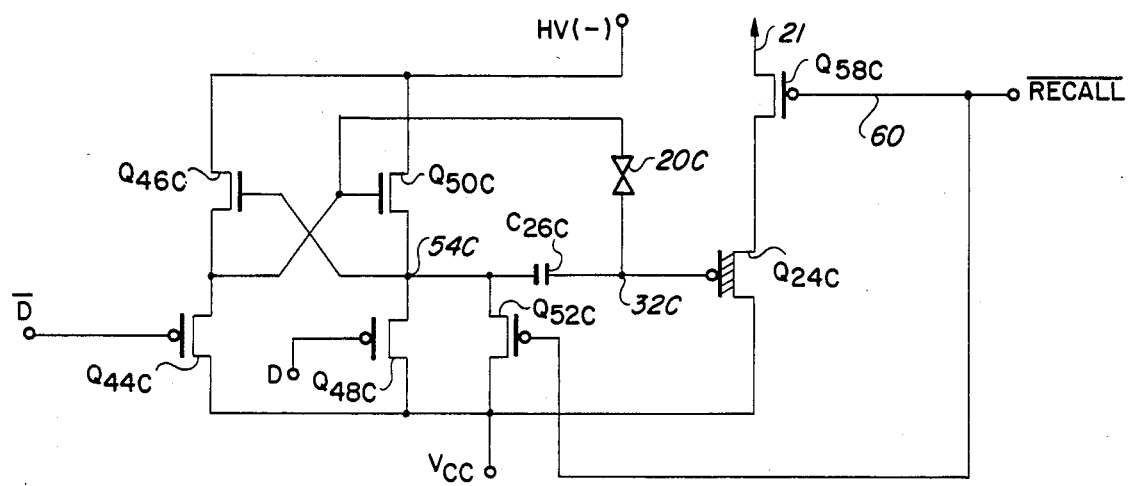
FIG. 7 is a detailed schematic diagram of an alternate embodiment of the single ended circuit of FIG. 5 as it is implemented in P-well CMOS technology.
Figure 8:
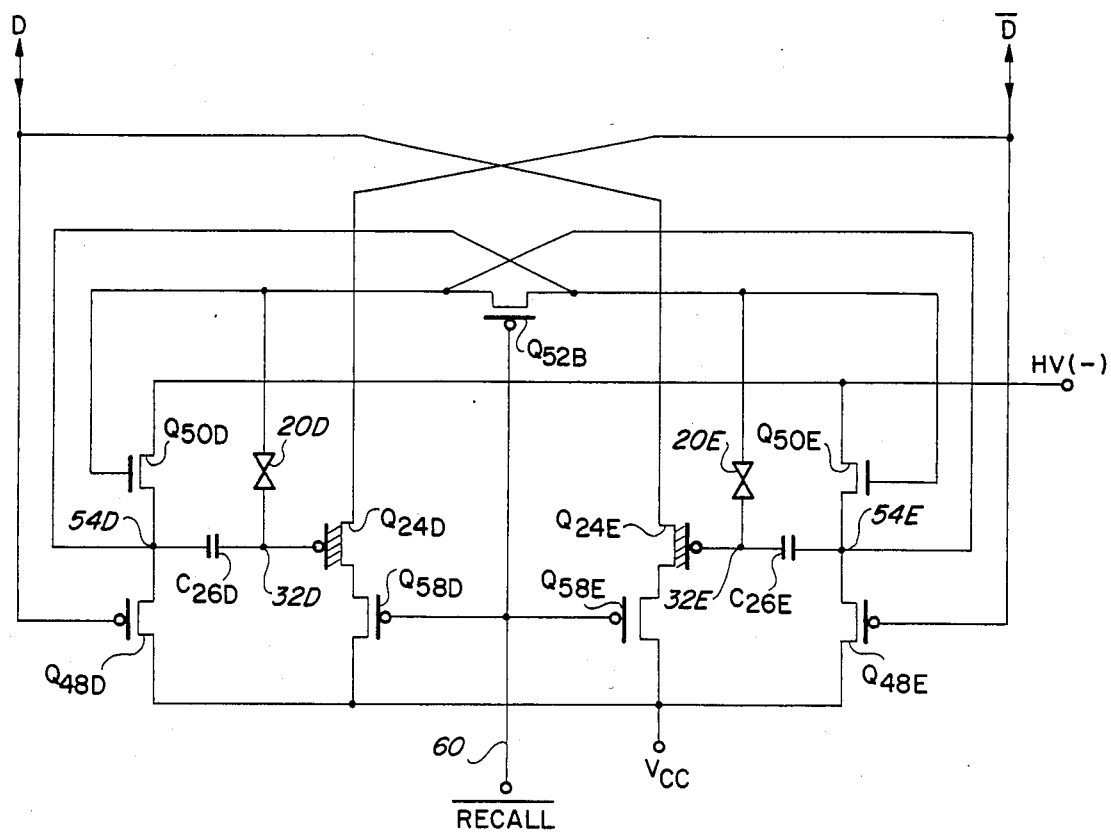
FIG. 8 is a detailed schematic diagram of the circuit of FIG. 6 as it is implemented in P-well CMOS technology.

FIGS. 7 and 8 illustrate, respectively, the circuits of FIGS. 5 and 6, as implemented in P-well CMOS technology. The like reference numerals carry a "C" suffix in FIG. 7 and "D" and "E" suffixes in FIG. 8.

Figure 9:
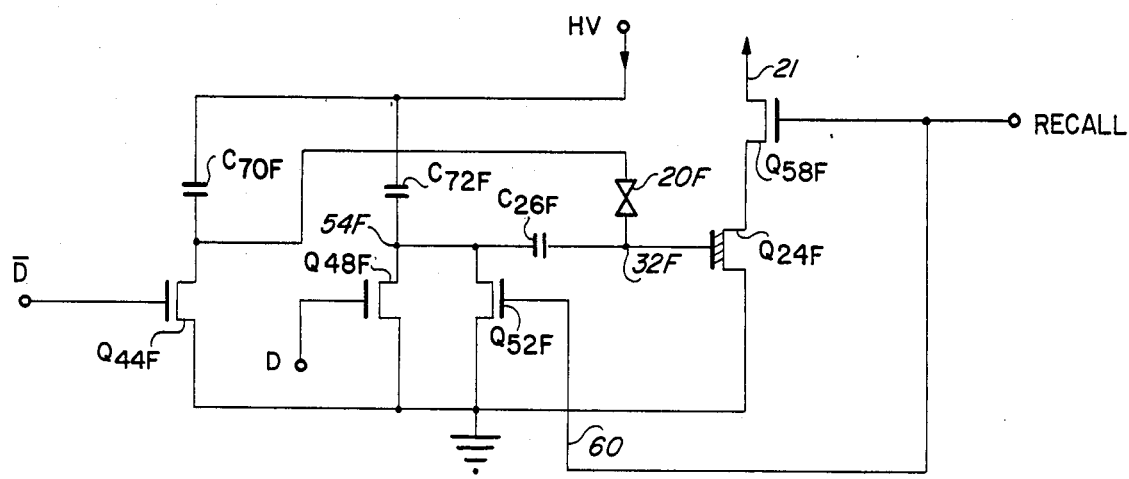
FIG. 9 is a detailed schematic diagram of the circuit of FIG. 5 as it is implemented in NMOS technology.
Figure 10:
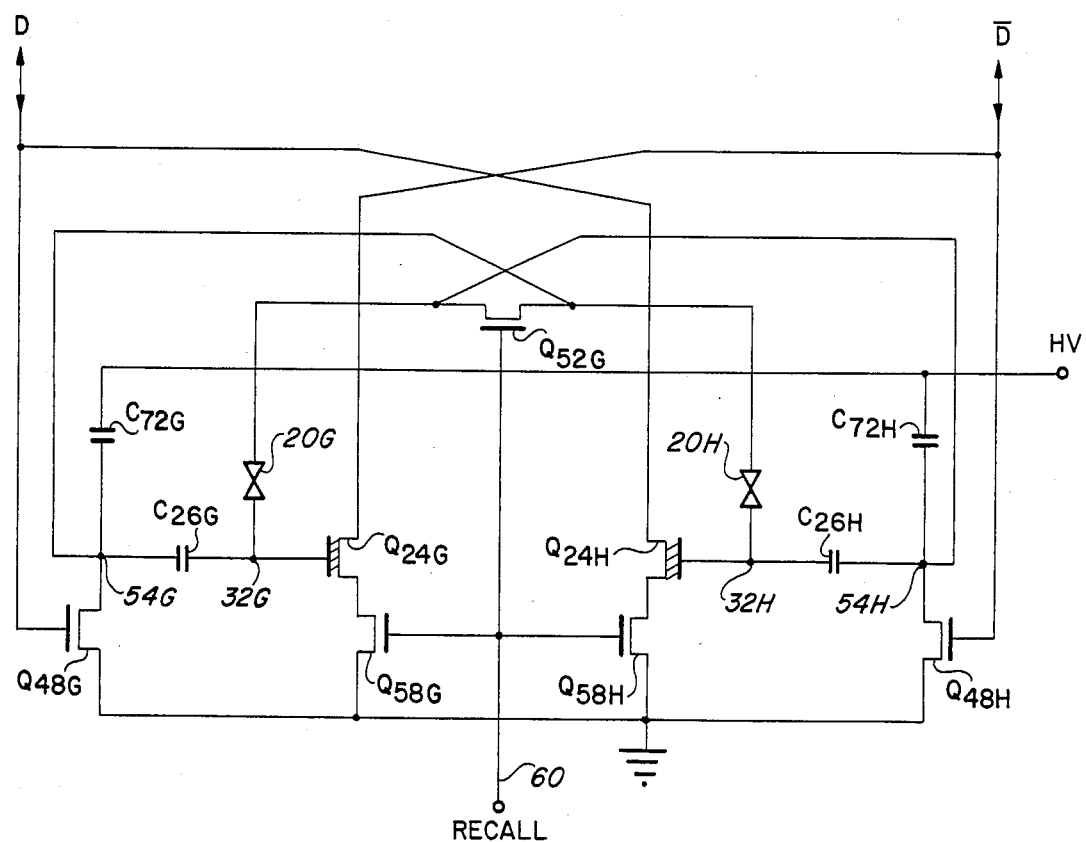
FIG. 10 is a detailed schematic diagram of the circuit of FIG. 6 as it is implemented in NMOS technology.

FIGS. 9 and 10, respectively, illustrate the circuits of FIGS. 5 and 6 as implemented in NMOS with N-channel devices; there are no P-channel devices employed. Capacitors $C_{70}$ and $C_{72}$ have been added for this implementation. While like reference numerals are used, they carry an "∓F" suffix in FIG. 9 and "G" and "H" suffixes in FIG. 10.

Figure 11:
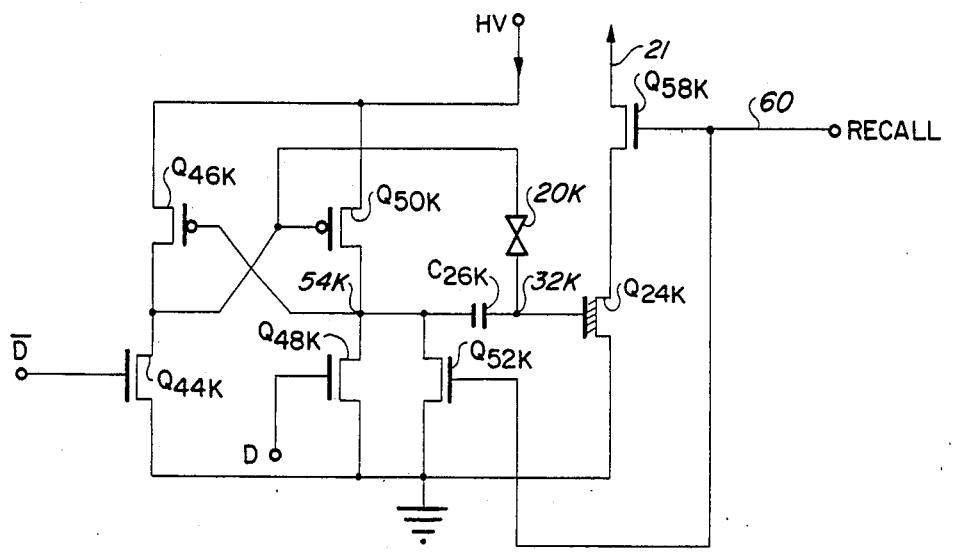
FIG. 11 is a detailed schematic diagram of an embodiment of the circuit of FIG. 5 as it is implemented in N-well CMOS technology.
Figure 12:
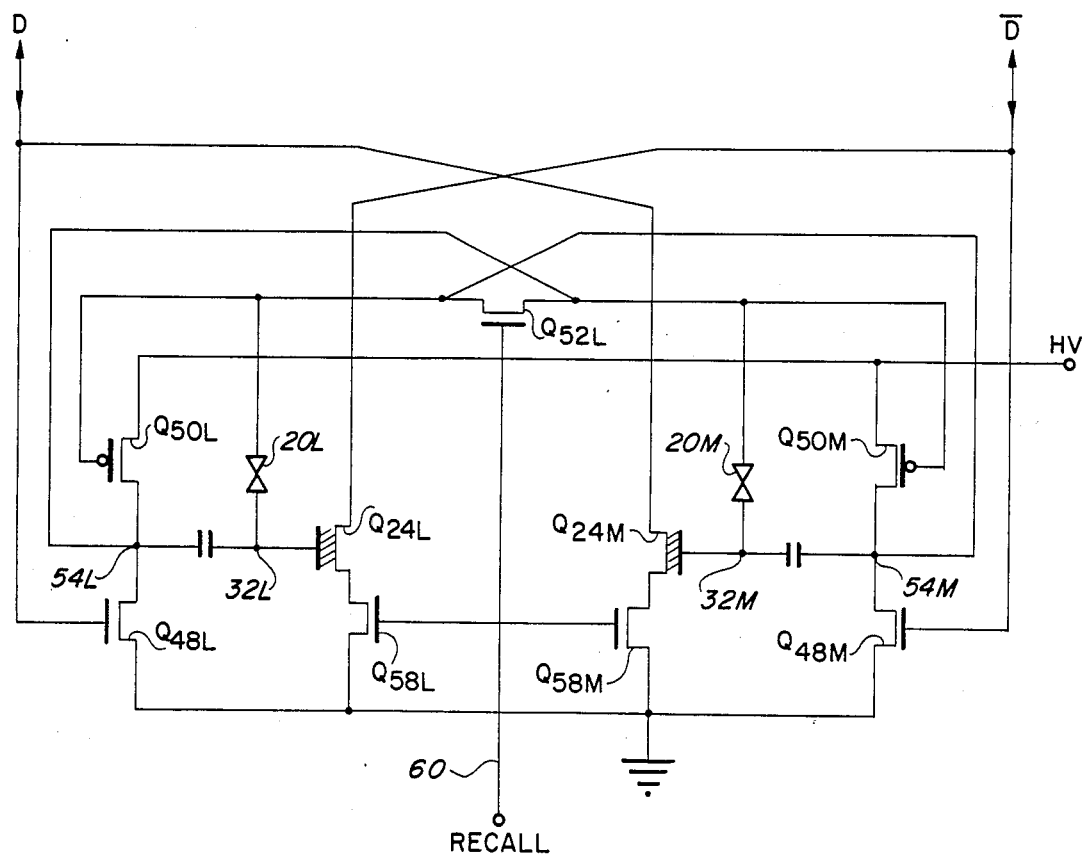
FIG. 12 is a detailed schematic diagram of an embodiment of the circuit of FIG. 6 as it is implemented in N-well CMOS technology.

FIGS. 11 and 12 are illustrative of the circuits of FIGS. 5 and 6, respectively, as they are implemented in N-well CMOS technology. It should be noted that the same reference numerals are used to identify those elements of the circuits which perform the functions of those same reference numeraled elements of FIGS. 4, 5 and 6, but they carry a "K" suffix in FIG. 11 and "L" and "M" suffixes in FIG. 12.

Figure 13:
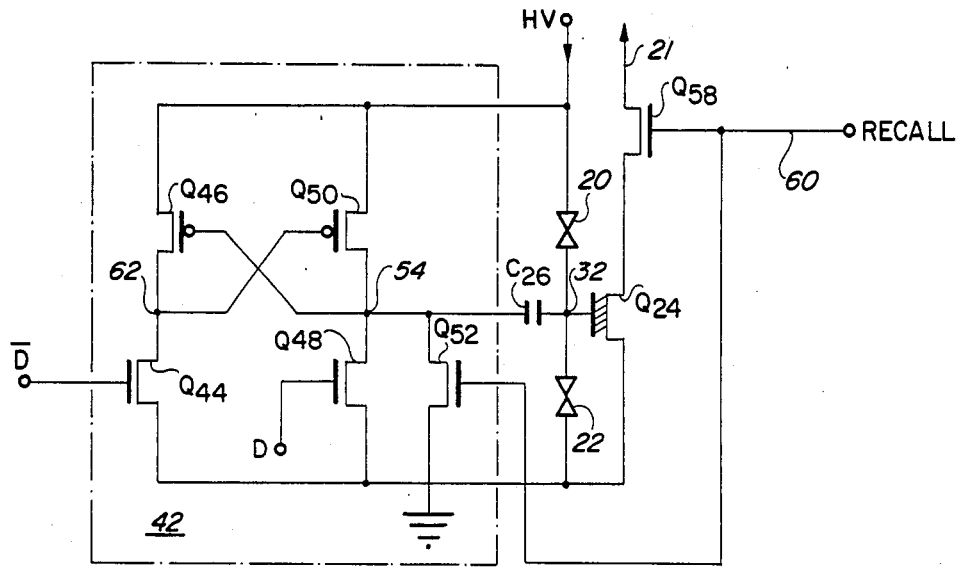
FIG. 13 is a detailed schematic diagram of one embodiment of the invention in N-well CMOS technology as applied to a single ended cell in the prior art circuit of FIG. 1.

FIG. 13 is a detailed schematic diagram of an embodiment of the invention in N-well CMOS technology as applied to a single ended cell in the prior art circuit of FIG. 1 wherein elements carrying like reference numerals perform the same function as that of the other elements disclosed in the various drawings of this disclosure.

Figure 14:
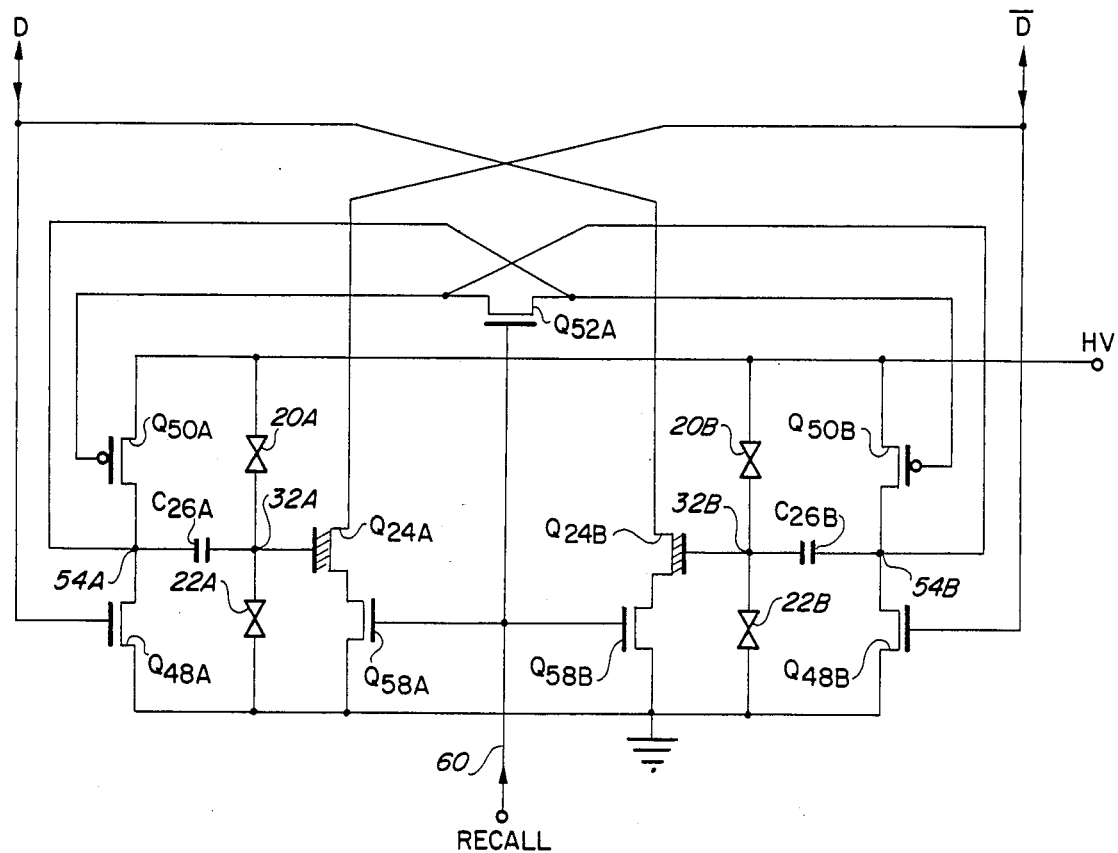
FIG. 14 is a detailed schematic diagram of the embodiment of the invention as shown in FIG. 13, but as applied to a differential cell, as shown in FIG. 2.

FIG. 14 is a detailed schematic diagram of the embodiment of the invention as shown in FIG. 13, but as applied to a differential cell, as shown in FIG. 2. The "A" and "B" suffixes identify the duplicate elements required for the differential version of the circuit.

Figure 15:
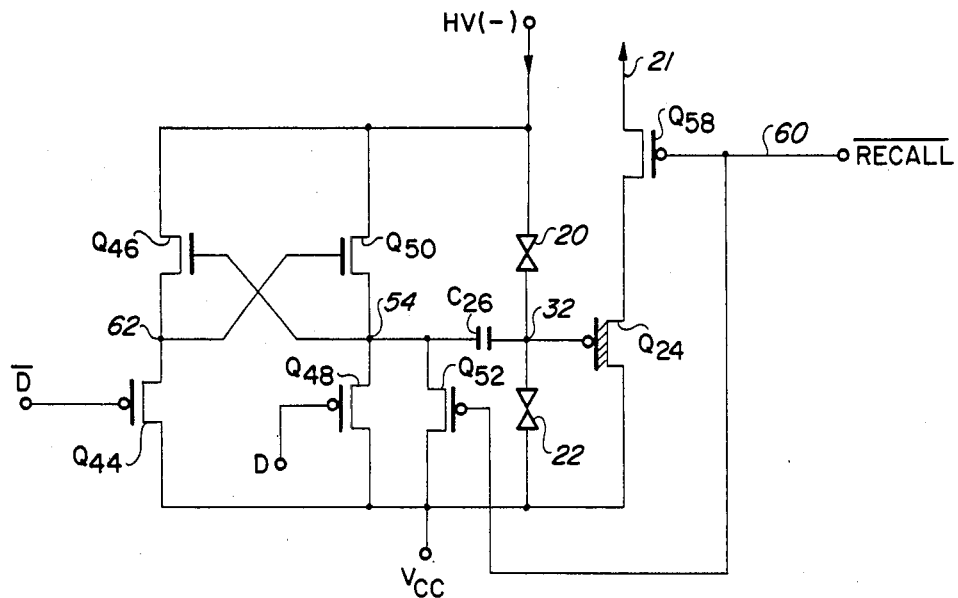
FIG. 15 is a detailed schematic diagram of an alternative embodiment of the invention of FIG. 13 as it is implemented in P-well CMOS technology.

FIG. 15 is a detailed schematic diagram of an alternative embodiment of the invention of FIG. 13 as it is implemented in P-well CMOS technology. Again, like reference numerals identify elements which perform similar functions to those of FIG. 13.

Figure 16:
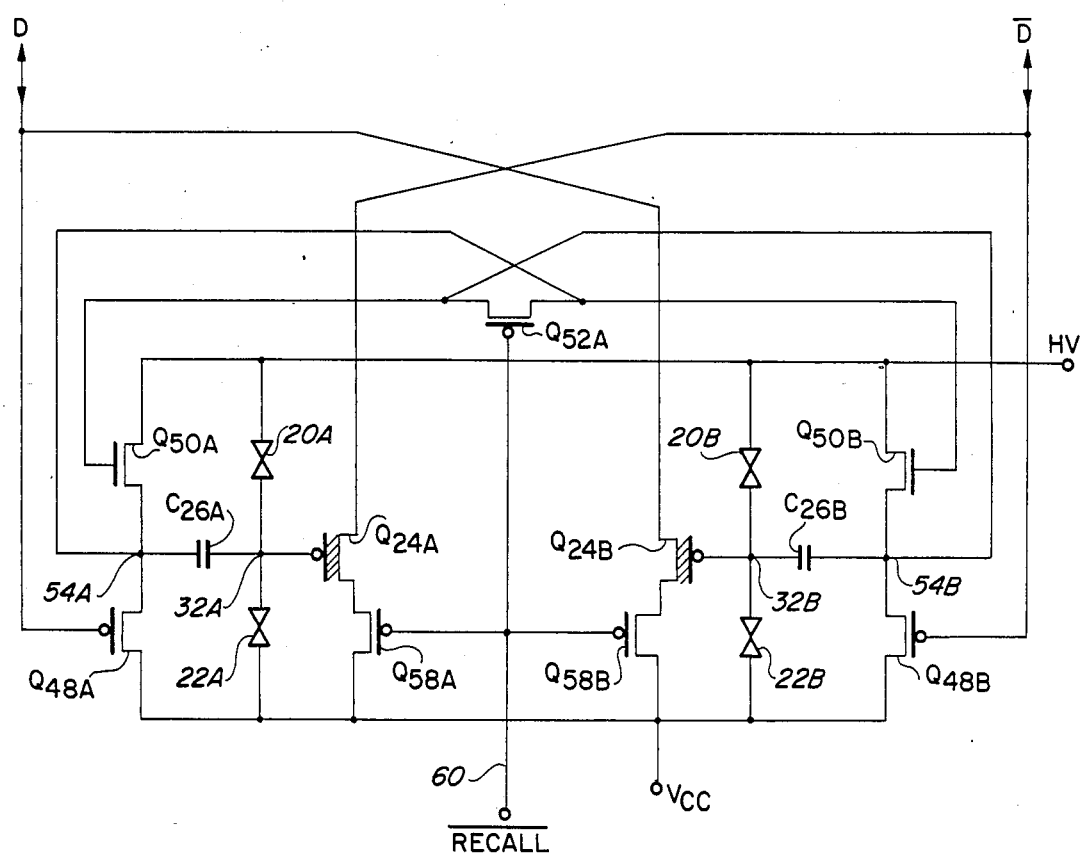
FIG. 16 is a detailed schematic diagram of an alternative embodiment of the invention of FIG. 14 as it is implemented in P-well CMOS technology.

FIG. 16 is a detailed schematic diagram of an alternative embodiment of the invention of FIG. 14 as it is implemented in P-well CMOS technology. Like reference numerals identify elements which perform functions similar to those of FIG. 14.

There are several advantages resulting from the use of the circuits described in FIGS. 7–12 over the prior art circuits of FIGS. 1 and 2. The series path through two FN devices 20, 22 from the high voltage (HV) node to ground does not exist in the fully improved circuits of the invention. Since a capacitor always appears in series with the single FN device used in the improved circuits of the invention, the design constraint on the choice of high voltage value, existent in the prior art circuits of FIGS. 1 and 2, is removed.

The use of half as many FN tunneling devices greatly improves integrated circuit yields since yield of acceptable thin tunneling devices is one of the more challenging aspects of manufacturing non-volatile storage elements.

In the fully improved versions of the invention, where only one FN device is used per cell module, the current flow is reversed during the charge and discharge cycles which acts to reduce the Fowler-Nordheim voltage "walkout" problem.

In the case of the differential storage cell illustrated in FIGS. 8, 10 and 12 there is a still further advantage in that the cell will continue to operate, even though one of the FN tunneling devices were to fail. Due to the use of the level shifters and the interconnection technique taught herein, the programming of the two tunneling elements is independent. Failure of one of the FN devices (manifested as a relatively low shunt resistance across the failed unit) has no effect on the operation of the surviving element. It should be noted, however, that the benefit of differential operation is lost and the circuit then behaves like the single ended circuit of FIG. 5; there is less operating margin.

While the invention has been particularly shown and described herein with reference to a preferred embodiment thereof, it will be understood by those skilled in the art that various other modifications and changes may be made to the present invention from the principles of the invention as herein described without departing from the spirit and scope as encompassed in the accompanying claims. Therefore, it is intended in the appended claims to cover all such equivalent variations which may come within the scope of the invention as described.

What is claimed is:

1. A non-volatile shadow memory cell controlled by input switching signals, the combination comprising:
   a non-volatile storage element;
   an isolation element for charging and discharging said non-volatile storage element;
   means for charging said non-volatile storage element in a first direction, said means for charging said non-volatile storage element comprising said isolation element; and
   means for discharging said non-volatile storage element in a second direction, said means for discharging said non-volatile storage element comprising said isolation element to provide a discharging current.

2. The non-volatile shadow memory cell in accordance with claim 1 wherein at least one of said means for charging and said means for discharging further comprises:
   input/output means for level shifting the switching signal to said isolation element.

3. The non-volatile shadow memory cell in accordance with claim 1 wherein said isolation element comprises:
   a Fowler-Nordheim tunneling element.

4. The non-volatile shadow memory cell in accordance with claim 3 wherein at least one of said means for charging and said means for discharging further comprises:
   input/output means for level shifting the switching signal to said isolation element

* * * * *